United States Patent [19]

Hezel

[11] 4,253,881
[45] Mar. 3, 1981

[54] SOLAR CELLS COMPOSED OF SEMICONDUCTIVE MATERIALS

[76] Inventor: Rudolf Hezel, Ringstr. 23, 8521 Spardorf, Fed. Rep. of Germany

[21] Appl. No.: 83,248

[22] Filed: Oct. 10, 1979

[30] Foreign Application Priority Data

Oct. 23, 1978 [DE] Fed. Rep. of Germany ....... 2846096
Dec. 11, 1978 [DE] Fed. Rep. of Germany ....... 2853412

[51] Int. Cl.$^3$ ............................................. H01L 31/04
[52] U.S. Cl. .................................... 136/256; 136/255; 357/30; 357/54
[58] Field of Search ....................... 136/89 CC, 89 SJ; 357/30, 54

[56] References Cited

U.S. PATENT DOCUMENTS

| | | | |
|---|---|---|---|
| 4,070,689 | 1/1978 | Coleman et al. | 357/30 |
| 4,090,213 | 5/1978 | Maserjian et al. | 357/30 |

OTHER PUBLICATIONS

R. J. Stirn et al., "A 15% Efficient Antireflection Coated Metal-Oxide-Semiconductor Solar Cell", *Appl. Phys. Lett.*, vol. 27, pp. 95–98 (1975).
G. C. Salter et al., "Silicon Solar Cells Using Natural Inversion Layers Found in Thermally Oxidized p-Silicon", *Solid State Electronics*, vol. 20, pp. 95–104, (1977).
P. Van Halen et al., "Improvement of the Efficiency of Silicon Mis-Inversion Layer Solar Cells", Proceedings 1977 European Photovoltaic Conf., pp. 280–288 (Reidel Pub. Co.).

*Primary Examiner*—Aaron Weisstuch
*Attorney, Agent, or Firm*—Hill, Van Santen, Steadman, Chiara & Simpson

[57] ABSTRACT

A solar cell is composed of a semiconductive material having an active zone in which charge carriers are produced by photons which strike and penetrate into the solar cell. The cell is comprised of a semiconductive body having an electrically insulating laminate with metal contacts therein positioned on the semiconductor body in the active zone thereof. The insulating laminate is composed of a double layer of insulating material, with the layer in direct contact with the semiconductive surface being composed of $SiO_2$ which is either natural or is produced at temperatures below 800° C. and the layer superimposed above the $SiO_2$ layer being composed of a different insulating material, such as plasma-produced $Si_3N_4$. In certain embodiments of the invention, a whole-area pn-junction is provided parallel to the semiconductive surface. The solar cells of the invention exhibit a higher degree of efficiency due to a higher fixed interface charged density, and low surface recombination velocity, an increased UV sensitivity, improved surface protection and passivation and improved anti-reflection characteristics relative to prior art solar cell devices.

23 Claims, 6 Drawing Figures

SOLAR CELLS COMPOSED OF SEMICONDUCTIVE MATERIALS

BACKGROUND OF THE INVENTION

1. Field of the Invention

The invention relates to semiconductive solar cells and somewhat more particularly to solar cells composed of semiconductive materials having an active zone provided with an electric insulating coating with metal contacts therein so that charge carriers are produced in the active zone via energy striking and penetrating into such cell.

2. Prior Art

As an alternative to conventional solar cells having a flat pn-junction parallel to a semiconductor surface, the so-called MIS solar cell (metal-insulator-semiconductor) is known. In such devices, pairs of electron holes produced by the light energy are separated in an electric field of a Schottky contact, where metal and semiconductor are separated by a thin insulating layer (having a thickness of less than 5 nm). In instances where the semiconductive material is silicon, the thin insulating layer is a $SiO_2$ layer. In comparison to normal Schottky contact solar cells, this oxide layer, through which electrons can tunnel, is characterized by a higher open-circuit under illumination without substantial increase in the series resistance of the cell. A MIS solar cell of this kind is disclosed for example, in an article by R. J. Stirn and Y. C. M. Yeh in "Applied Physics Letters," Vol. 27, No. 2, July 7, 1975, pages 95–98.

Advantages of such MIS solar cells, in comparison with conventional pn-cells include:

(a) no high-temperature manufacturing steps and thus lower production costs, in comparison with pn-cells;

(b) no crystal structure defects resulting from diffusion, which structures can act as recombination centers and can thus substantially reduce the efficiency of a device;

(c) higher efficiencies can be achieved for short wavelengths (UV) since the electric field extends to the semiconductor surface and consequently the absorption of the UV-light occurs in a zone of high field strength;

(d) a high radiation resistance;

(e) more adaptable for use of polycrystalline and amorphous semiconductive materials so that cheaper devices are attained.

However, difficulties are achieved in producing a uniform large-area MIS contact, including the required extremely thin light-permeable metal layer.

Another alternative in attaining relatively cheap solar cells which at least partially avoids the above mentioned difficulties, consists in using a so-called inversion layer solar cell. In such devices, the charge carriers are accumulated by using a conductor path grid composed of a relatively thick metal layer with an underlying pn-junction, such as disclosed by G. C. Salter and R. E. Thomas in "Solid State Electronics" Vol. 20, 1977, pages 95–104, or a MIS Schottky contact such as disclosed by P. van Halen, R. Mertens, R. Van Overstraeten, R. E. Thomas, J. Van Meerbergen in "Proceedings of the European Photovoltaic Conf." 1977, pages 280–288, D. Reidel Publishing Co., Dordrecht, Holland/Boston, U.S.A. The area between the metal paths is coated with a transparent dielectric layer which can simultaneously function as an anti-reflection layer. Fixed insulator charges on the interface between the insulator and the semiconductor produce an inversion layer (composed of minority charge carriers) followed by a space charge zone in the semiconductor, directly beneath the dielectric layer. The inversion layer forms one side of an induced pn-junction in which a high electric field exists and which promotes the collection of the photo-charge carriers. The resistance of such inversion layer is comparatively low; in such thin surface inversion layers, the minority charge carriers produced by the light diffuse, as in a metal film, toward the contacts where they are discharged.

Similar to the above-discussed MIS cells, inversion layer solar cells must also exhibit a higher UV sensitivity than pn-cells because of the lower surface recombination velocity. In order for the conductivity of the inversion layer and thus for the photo-current to be as high as possible, the interface charge density ($Q_{SS}$) must be as high as possible and at the same time the density of the fast surface states ($N_{SS}$) must be low. The fast surface states reduce the conductivity due to the capture of minority charge carriers (recombination).

Accordingly, the main requirements for inversion layer solar cells are:

(1) a high density of fixed interface charges in order to achieve a highly conductive inversion layer;

(2) a low density of fast surface states in order to keep the loss (recombination) of charge carriers low.

When a thermally produced oxide is used as a dielectric on silicon, apart from the disadvantageous use of high temperatures of above 1000° C. (power consumption, crystal defects, etc.) which are required to form such a layer, an increase in interface charge density, $Q_{SS}$ and thus a reduction in the layer resistance of the inversion boundary layers is always coupled with an increase in the density of the fast surface states, $N_{SS}$. The increase in $Q_{SS}$ can be achieved by annealing in oxygen at relatively low temperatures and by selecting (111)-silicon in place of (100)-silicon as a substrate material. In extreme instances, $Q_{SS}/q$ values of approximately $1 \times 10^{12}$ cm$^{-2}$ are achieved together with very high $N_{SS}$ values of approximately $10^{12}$ cm$^{-2}$ eV$^{-1}$.

SUMMARY OF THE INVENTION

The invention provides a solar cell composed of a semiconductive material having an active zone with an insulating laminate on such zone so that charge carriers are produced in the zone when energy impinges on the cell and fixed interface charges are decoupled via the insulating laminate from the fast surface states.

In accordance with the principles of the invention, a solar cell of the above described construction is characterized by an insulating lamina comprised of a double layer whereby a first layer in direct contact with the semiconductive surface is composed of a relatively low temperature produced silicon oxide, such as one which is either naturally grown or thermally produced at temperatures below about 800° C. and a second layer superimposed onto the first layer is composed of a different insulating material relative to the first insulating layer. Because the fixed charges are incorporated into the interface of the two insulating layers, such layers can be adjusted and optimized, largely independently of the properties of the silicon/silicon oxide interface.

In certain embodiments of the invention, the second insulating layer is composed of an insulating material selected from the group consisting of low-temperature produced silicon nitride, silicon oxynitride, aluminum oxide and vapor-deposited silicon dioxide.

In certain embodiments of the invention, foreign ions, preferably alkali ions are incorporated into the second insulating layer, particularly into a silicon nitride layer. In such embodiments, a substantial increase in the charge density, $Q_N$, is achieved.

In accordance with the principles of the invention, all layers in the solar cell can be either chemically deposited by providing thermal energy, or in a glow discharge, by cathode sputtering or thermal vapor deposition in a vacuum.

In an exemplary preferred embodiment of the invention wherein silicon nitride comprises the second insulating layer, the following advantages are apparent in solar cells containing such silicon nitride layer, relative to the earlier described inversion layer solar cells and MIS solar cells.

In instances when a low-temperature silicon nitride layer is produced as a second insulating layer, for example by a reaction of silane ($SiH_4$) and ammonia ($NH_3$) in a resistance-heated or radiation-heated reactor or in a glow discharge (plasma), the following advantages are attained:

1. With a reduced-deposition temperature, the density of the positive interface charges, $Q_N/q$, increases. At relatively low temperatures (approximately 640° C.), a very high value of $Q_N$ (i.e., about 5 to $7 \times 10^{12}$ cm$^{-2}$) is achieved; approximately one order of magnitude higher than in the case of thermally produced $SiO_2$. The amount of time required to achieve such coating is about 10 to 20 minutes.

2. With this type of structure, the values of $Q_N$ do not appreciably change whether a (111)-silicon or a (100)-silicon substrate or a n-doped or p-doped substrate is utilized, i.e., the charge density is substantially independent of the substrate orientation and the nature of the doping. This fact allows the use of p-silicon with (100)-orientation in order to take advantage of the higher mobility of electrons as minority charge carriers and the smaller number of fast surface states $N_{SS}$ of the (100)-surface. (In instances of thermally-produced $SiO_2$, it is necessary to use a (111)-silicon substrate in order to attain high charge densities).

3. It is feasible to use silicon nitride on n-doped substrates as the required negative interface charges can easily be produced by subsequent annealing above the deposition temperature (or by deposition at higher temperatures). This can be exploited in MIS solar cells as the work function difference between aluminum and n-doped silicon is greater than with p-doped silicon.

4. Low nitride deposition temperatures also result in very low $N_{SS}$ values so that the surface recombination velocity is relatively low. This is due to the hydrogen annealing which is carried out automatically during deposition.

5. The mechanical stress in the nitride layer increases simultaneously with an increasing deposition temperature. Measurements taken during the development of the invention indicate that only at deposition temperatures higher than about 1000° C. the carrier lifetime was reduced by defects introduced into the substrate.

6. Silicon nitride functions as a very good passivation layer, as is known from its use in integrated circuits. Thus, it simultaneously protects the surfaces of the solar cell from the diffusion of foreign materials.

7. The silicon nitride layer also functions as an antireflection on coating which, in comparison to $SiO_2$, has an index of refraction that can be better matched to that of silicon.

8. In instances where cheaper polycrystalline silicon or amorphous silicon is used as a substrate material, the use of a silicon nitride layer presents no problem since no oxidation is required as in the case of $SiO_2$, which may be obstructed by grain boundaries.

9. The use of oxynitride (as by the addition of oxygen during deposition of a conventional nitride layer) results in better transmission properties and lower mechanical stress, with very little difference in the interface charges $Q_N$.

10. Because of the traps for charge carriers which exist in silicon nitride (MNOS storage effect), the density of the interface charges $Q_N$ can be increased by a multiple of its original value by temporarily connecting an electrical field to the overall nitride surface on top of a solar cell.

11. By incorporating foreign ions (i.e., alkali ions) into a Si-nitride layer, a considerable increase in the charge density $Q_N$ can be attained.

DESCRIPTION OF THE PREFERRED EMBODIMENTS

Figure 1:
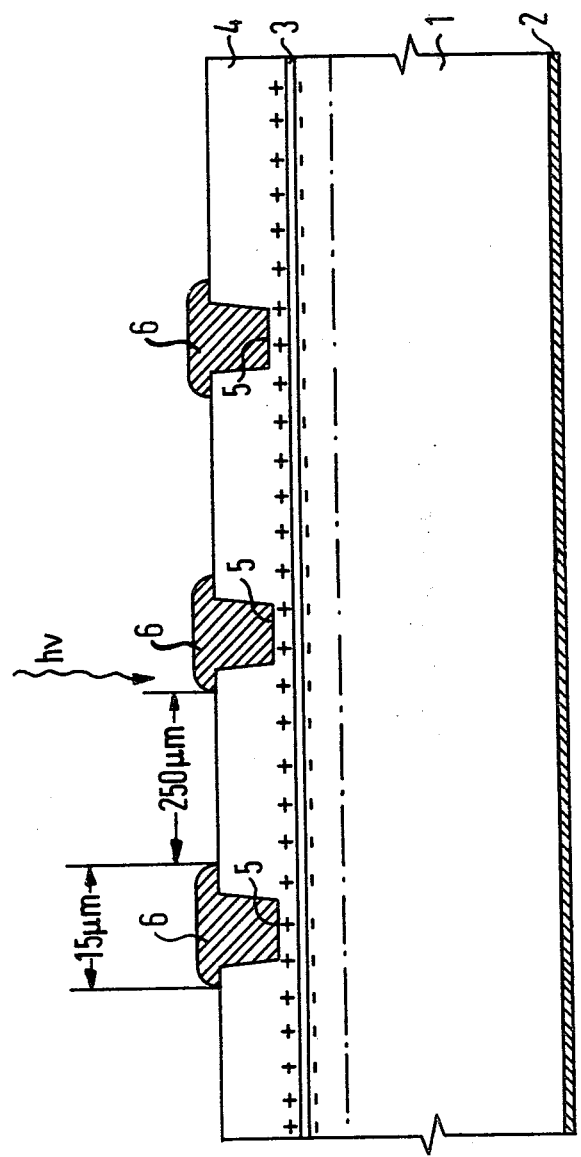
FIG. 1 is partially, somewhat schematic view of an exemplary silicon nitride inversion layer solar cell having MNOS contacts and constructed in accordance with the principles of the invention.

In FIG. 1, an exemplary solar cell is illustrated and comprises a p-doped silicon substrate 1 with a rear contact 2 positioned on the entire bottom surface thereof. An insulating laminate comprised of double insulating layers 3 and 4 is provided on an active zone (front surface of the substrate 1. A first insulating layer 3 is positioned directly in contact with the semiconductor surface and is comprised of a relatively thin, naturally grown $SiO_2$ layer and a second somewhat thicker (about 50 to 300 nm) insulating layer 4 is positioned in contact with layer 3 and is comprised of silicon nitride. Layer 4 is provided with partial windows along spaced intervals to define contact surfaces 5 beneath aluminum metal grids or fingers 6. The thickness of the silicon nitride beneath the contact surfaces 5 is very thin (approximately 1 to 4 nm). The approximate lateral dimensions of grids and the spacing between adjacent metal strips is shown on the drawings. The production of such silicon nitride layer does not require any high temperature processes. Two photo-masking steps are adequate to attain the structure shown;

(a) to define the contact surfaces 5 (etching of the initially uniformly applied silicon nitride layer 4), and (b) to define the metal grid fingers 6 (etching of a uniformly applied metal layer, such as an aluminum layer).

In the illustration, the broken line represents the inversion layer which runs parallel to the substrate surface and the dash-dotted line represents the approximate width or depth of the space charge zone. The cross-containing line represents the positive charge carriers in the insulating layer 4.

Figure 2:
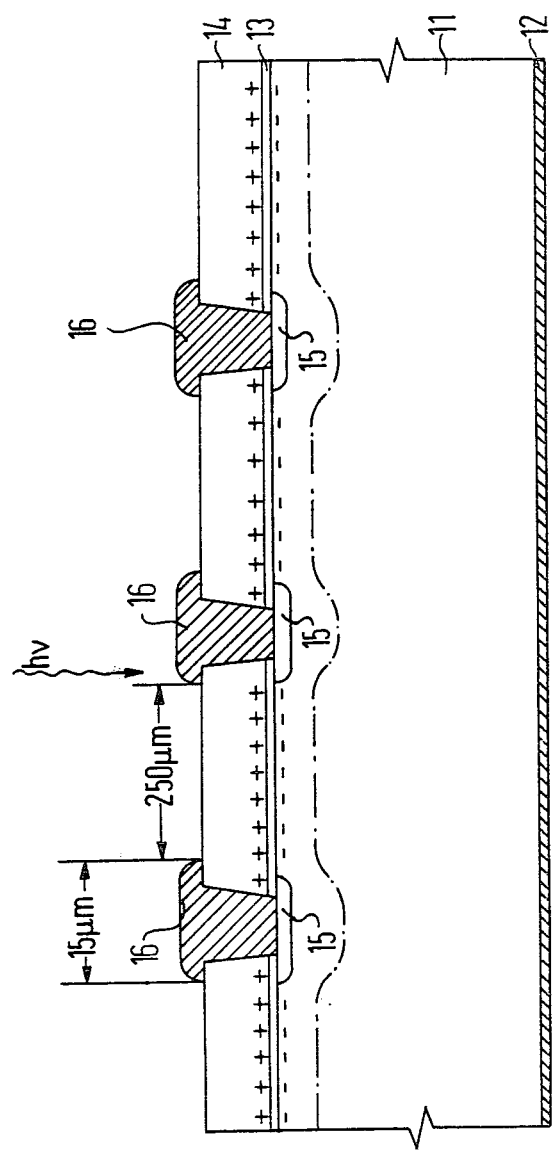
FIG. 2 is a somewhat similar view of a silicon nitride solar cell having diffused contacts and constructed in accordance with the principles of the invention.

In FIG. 2 a p-doped silicon body 11 is provided with a rear contact 12 and is otherwise constructed similar to the solar cell described in FIG. 1, except that the contact surfaces 15 are formed by spaced-apart pn-junctions. The formation of such junctions requires a diffusion step or an ion-implantation step, followed by an annealing step and two photo-masking steps; one of which is used to establish the diffusion zones 15 and the other of which is used to provide the metal fingers 16. A naturally grown silicon oxide layer 13 having a thickness of about 1.5 to 2 mn and a low-temperature produced silicon nitride layer 14 having a thickness of about 50 to 300 nm comprise the insulated laminate on this solar cell.

Figure 3:
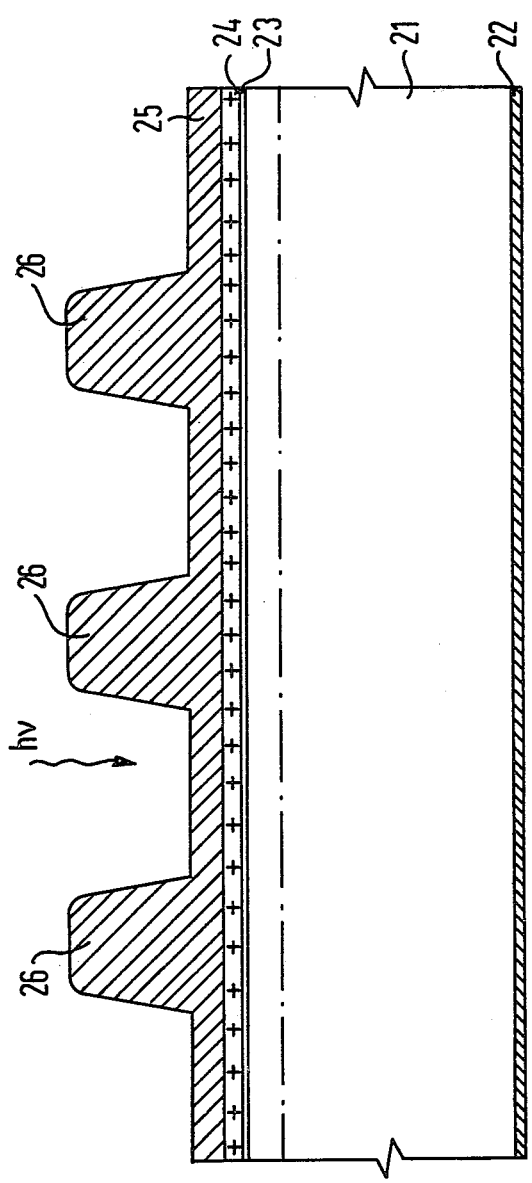
FIG. 3 is also a somewhat similar view of an exemplary MNOS solar cell constructed in accordance with the principles of the invention.

FIG. 3 illustrates one of the simplest solar cell devices constructable in accordance with the principles of the invention. A p-doped silicon body 21 is provided with a rear contact 22 in a conventional manner. A naturally grown or specially provided relatively thin (approximately 1.5 mn) $SiO_2$ layer 23 is provided directly on the upper surface of the body 21 and a somewhat thicker (approximately 1 to 4 nm) silicon nitride layer 24 is superimposed onto the $SiO_{12}$ layer 23. Thereafter, a transparent metal layer 25 having a thickness of about 2.5 mn and, for example, composed of aluminum or gold is provided above the nitride layer 24, along with a metal finger grid arrangement 26, which functions to discharge the current. In the production of this type of solar cell structure, only one metal mask is required for the vapor deposition of the grid arrangement 26 and such mask does not require any special adjustments.

Figure 4:
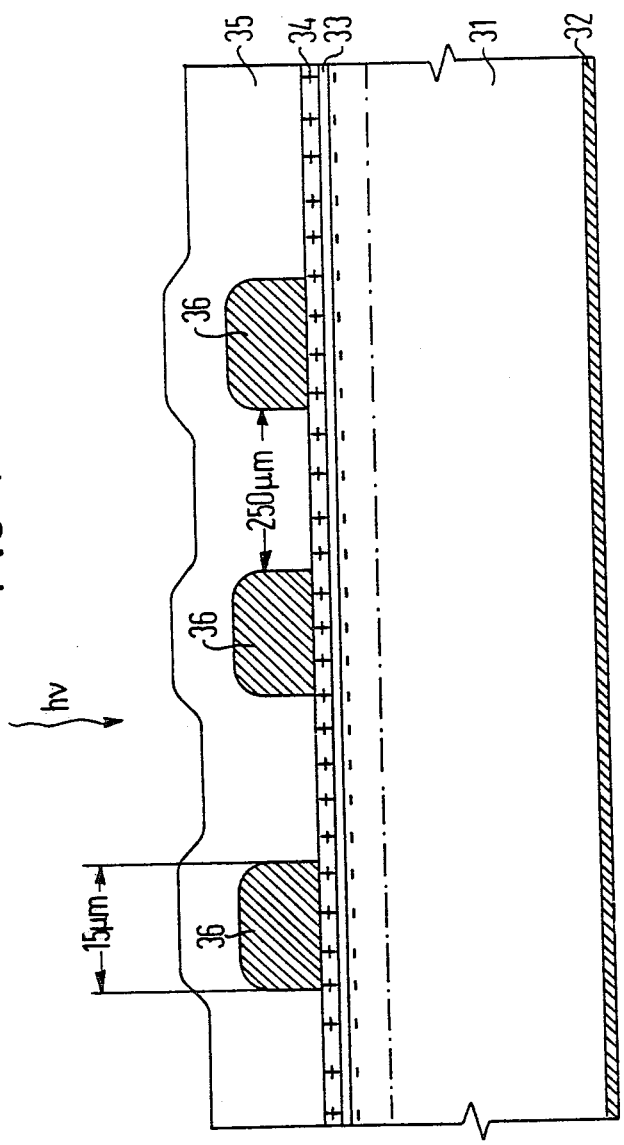
FIG. 4 is a somewhat similar view of an exemplary silicon niitride inversion layer solar cell having MIS contacts and a variable boundary surface charge density, $Q_N$, constructed in accordance with the principles of the invention.

FIG. 4 illustrates a solar cell of the invention which exploits the MNOS storage effect in order to vary the boundary surface charge by a connection of an external voltage. In this manner, the charges can be considerably increased. In these embodiments, it has been established that especially in the silicon nitride layers, which are deposited at low temperatures following the silicon oxide coating, as a result of applied negative voltages, in addition to the already high positive interface charges further positive charges can be injected into the insulator out of the silicon. The flat band voltage is thus substantially moved into the negative range.

During the development of the invention, actual measurements and extrapolations indicated that even at temperatures of 120° C. over a period years, only a small proportion of the stored charges are discharged.

This means of charge storage on the one hand permits a substantial increase in the conductivity of the inversion layer, and on the other hand, allows workers to study and optimize the influence of positive interface charges on the efficiency of a solar cell without thereby affecting any other factors such as, among other things, the contact resistance of the rear metal layer. This arrangement easily permits a further reduction in the resistance of an inversion layer.

The structure illustrated at FIG. 4 is quite similar to the structure described at FIG. 1, a difference being that in the FIG. 4 structure, the silicon nitride layer 35 is applied in a thickness ranging between 50 to 300 nm as a final step, after the application of the metal grids 36. Technologically, this means that if the silicon nitride layer 34 is to be produced by deposition from a gas phase at an optimum temperature of 600° C., metals which have a higher melting point that aluminum (for example gold, silver, platinum, nickel-copper, etc.) must be utilized in forming the contact grids 36. However, if the nitride layer 34 is deposited via a glow discharge at about 300° C., it is possible to use aluminum for the metal grids. In this structure, the relatively thin silicon nitride layer 34 (1 to 4 nm in thickness) is optional. A naturally grown oxide layer 33 is provided on the upper surface of the silicon crystal 31.

In this arrangement, the additional storage of charges at the oxide-nitride interface is carried out in a simple manner in that a negative voltage pulse is temporarily connected to the solar cell via an electrode of comparable size to that of the solar cell. In this instance, it is important that the metal grids 36 carry the substrate potential and thus should be connected to the rear contact 32 of the p-doped silicon crystal substrate 31 during the voltage pulse in order that the thin tunnel layer (layers 33 and 34) between the metal and the semiconductor ($SiO_2$ and $SiO_2$-$Si_3N_4$) is not destroyed by the high field strength.

Figure 5:
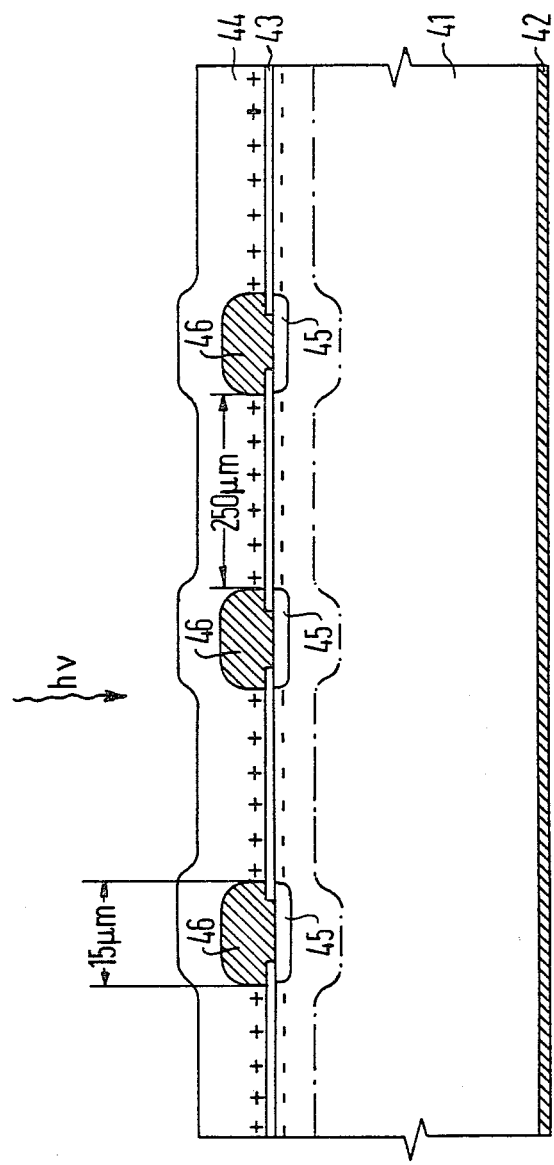
FIG. 5 is likewise a partially schematic elevational view of another exemplary silicon nitride inversion layer solar cell having diffused contacts and constructed in accordance with the principles of the invention.

FIG. 5 illustrates an exemplary device quite similar to that of FIG. 4 wherein the solar cell is provided with pn-junctions 45 which are either diffused or produced by ion implantation. Otherwise, the reference numerals in FIG. 5 refer to like portions of the structure in FIG. 4, except that they are in the 40-series.

Figure 6:
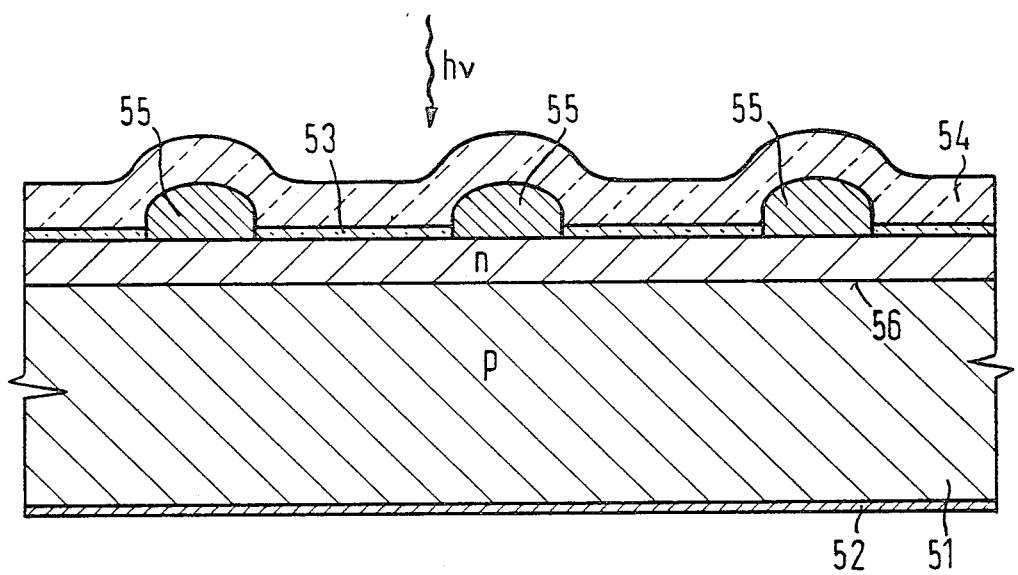
FIG. 6 is a somewhat similar view of an exemplary silicon nitride solar cell having a whole-area pn-junction and metal contacts thereon constructed in accordance with the principles of the invention.

Another exemplary structure of the invention is illustrated at FIG. 6 wherein a p-doped silicon body 51 is provided with a rear contact 52 and a double layer insulating laminate is provided on the front surface thereof. The insulating lamina comprises of a naturally grown relatively thin $SiO_2$ layer 53 and a somewhat thicker (approximately 80 nm) silicon nitride layer 54, for example produced by a glow discharge during the reaction of silane with ammonia at approximately 300° C. The nitride layer 54 can be deposited on the entire surface; however, the metal contacts 55 are preferably first vapor deposited through an appropriate mask and are comprised of, for example, aluminum. Of course, it is within the scope of the invention to provide a uniform silicon nitride layer, such as 54 only between the metal contacts, in which case a photo-masking step is required in order to expose the contact surfaces.

The entire pn-junction 56 which extends parallel to the surface of the substrate 51 is produced by ion implantation of, for example, phosphorus or arsenic and extends to a depth of about 0.05 to 0.5 μm and preferably about 0.2 μm. The metal finger grid arrangement 55 is freed for contact through windows etched into the silicon nitride layer 54 in the region of the metal contacts.

With the solar cell structure illustrated at FIG. 6, an improvement, in comparison to conventional pn-cells, consists in that the sensitivity (quantum efficiency) in the short-wave section of the sun spectrum is increased by the application of the silicon nitride layer or silicon oxynitride layer (which can be produced by incorporating oxygen during the conventional deposition of a silicon nitride layer). In other words, the electronic states, both interface states at the semiconductor-insulator interface and those which cause in the short life time of the minority charge carriers in the diffused semiconductor zone are reduced in respect to their effect as recombination centers by the extremely active hydrogen (as for example generated in the following reaction: $3SiH_4 + 4NH_3 \rightarrow Si_3N_4 + 12H_2$) which forms during the silicon nitride deposition.

In comparison with a similar solar cell without a silicon nitride layer, a 50% higher quantum efficiency was achieved in the wavelength range from 450 to 650 nm.

Additional drastic improvements are attainable with the use of silicon nitride layers in solar cells composed of polycrystalline and/or amorphous semiconductor material due to the high density of recombination centers present. Further, with $A^{III}B^V$ compound substrates as for example with GaAs solar cell substrates, wherein a substantially higher proportion of charge carriers is produced in the surface zone, the invention provides particularly beneficial results.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. A solar cell having a body composed of a semiconductive material with an active zone in which charge carriers are generated by energy impinging upon such cell and penetrating into it, said cell having an electrically insulating layer on the incident surface of said semiconductive material comprised of a double layer with metal contacts positioned therein and overlying said active zone, said double layer consisting of a first layer having a thickness greater than 0 and less than about 4 nm and being directly applied onto said semiconductive body and being composed of a material selected from the group consisting of natural silicon oxide and a silicon oxide generated at temperatures below 800° C., and a second layer directly applied onto said first layer and being composed of a material selected from the group consisting of silicon nitride and silicon oxynitride.

2. A solar cell as defined in claim 1 wherein the total thickness of said double layer is less than about 5.5 nm.

3. A solar cell as defined in claim 1 wherein the thickness of said second layer is in the range of about 50 to 300 nm.

4. In a solar cell as defined in claim 1 wherein said second layer is composed of silicon nitride which is produced by deposition from a gas phase in a reaction furnace means.

5. In a solar cell as defined in 1 wherein said second layer is composed of silicon nitride which is produced by deposition from a gas phase in a glow discharge.

6. In a solar cell as defined in claim 1 wherein said second layer is composed of a material selected from the group consisting of silicon nitride and silicon oxynitride, and said second layer includes foreign ions deliberately incorporated therein.

7. In a solar cell as defined in claim 6 wherein said foreign ions are alkali ions.

8. In a solar cell as defined in claim 1 wherein said metallic contacts at least partially penetrate into said second layer.

9. In a solar cell as defined in claim 1 wherein said metal contacts penetrate through said first and second layers and contact a highly doped zone on said semiconductive body.

10. In a solar cell as defined in claim 9 wherein said highly-doped zone is produced via diffusion or ion implantation.

11. In a solar cell as defined in claim 1 wherein said first layer has a thickness less than about 2 nm, said second layer has a thickness in the range of about 2 to 3 nm and a transparent metal layer is provided above said second layer and covers the surface areas between said metallic contacts.

12. In a solar cell as defined in claim 1 wherein said first layer has a thickness of less than about 2 nm, said second layer has a thickness in the range of about 1 to 4 nm, said metallic contacts being directly applied onto said second layer and a third insulating layer having a thickness in the range of about 50 to 300 nm is applied between and above said metallic contacts.

13. In a solar cell as defined in claim 12 wherein said third layer is composed of silicon nitride.

14. In a solar cell as defined in claim 1 wherein said semiconductive body is provided with spaced-apart highly-doped zones produced via diffusion or ion implantation and said metallic contacts penetrate said first layer above said highly doped zones so as to contact such zones and said second insulating layer having a thickness in the range of about 50 to 300 nm is applied between and above said metallic contacts.

15. In a solar cell as defined in claim 1 wherein said semiconductive body is provided with a whole-area pn-junction arranged parallel with a surface of said body and said metallic contacts penetrate said first layer so as to contact said pn-junction, and said second insulating layer having a thickness in the range of about 50 to 300 nm is applied between and above said metallic contacts.

16. In a solar cell as defined in claim 15 wherein said pn-junction has a depth within said semiconductive body ranging between about 0.05 to 0.5 μm.

17. In a solar cell as defined in claim 16 wherein said pn-junction is produced via ion implantation.

18. In a solar cell as defined in claim 16 wherein said pn-junction is produced via diffusion.

19. In a solar cell as defined in claim 15 wherein said second layer is composed of silicon nitride and has a thickness adapted for optimum anti-reflection characteristics.

20. In a solar cell as defined in claim 19 wherein said semiconductive material forming said solar cell body is silicon and said silicon nitride second layer has a thickness of about 80 nm.

21. In a solar cell as defined in claim 19 wherein said silicon nitride comprises a plasma-produced nitride.

22. In a solar cell as defined in claim 1 wherein said semiconductive material forming said solar cell body is selected from the group consisting of monocrystalline semiconductive material, polycrystalline semiconductive material, amorphous semiconductive material, silicon, germanium and $A^{III}B^V$ compounds.

23. In a solar cell as defined in claim 22 wherein said semiconductive material comprises p-doped silicon.

* * * * *